United States Patent
Gaynes et al.

(10) Patent No.: US 8,651,359 B2
(45) Date of Patent: Feb. 18, 2014

(54) FLIP CHIP BONDER HEAD FOR FORMING A UNIFORM FILLET

(75) Inventors: Michael A. Gaynes, Vestal, NY (US); Jae-Woong Nah, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 332 days.

(21) Appl. No.: 12/861,017

(22) Filed: Aug. 23, 2010

(65) Prior Publication Data
US 2012/0045869 A1      Feb. 23, 2012

(51) Int. Cl.
*B23K 1/00*       (2006.01)
(52) U.S. Cl.
USPC .............. 228/51; 228/49.5; 228/32; 438/107; 438/121

(58) Field of Classification Search
USPC ....................... 228/49.5, 51, 32; 438/107, 121
See application file for complete search history.

(56) References Cited

U.S. PATENT DOCUMENTS

| | | | | |
|---|---|---|---|---|
| 5,058,796 A | * | 10/1991 | Schwarzbauer | 228/44.3 |
| 5,632,434 A | * | 5/1997 | Evans et al. | 228/44.7 |
| 5,878,942 A | * | 3/1999 | Kodama et al. | 228/180.22 |
| 6,746,896 B1 | | 6/2004 | Shi et al. | |
| 6,890,795 B1 | * | 5/2005 | Wong et al. | 438/114 |
| 6,902,954 B2 | * | 6/2005 | Shi | 438/108 |
| 7,882,997 B2 | * | 2/2011 | Zakel et al. | 228/5.5 |
| 2002/0100791 A1 | * | 8/2002 | Mukuno et al. | 228/49.5 |
| 2007/0099412 A1 | * | 5/2007 | Miyazaki | 438/612 |
| 2007/0272991 A1 | * | 11/2007 | Zakel et al. | 257/414 |
| 2008/0035274 A1 | * | 2/2008 | Kanisawa | 156/583.1 |
| 2009/0008800 A1 | * | 1/2009 | Nakatani et al. | 257/778 |
| 2009/0127315 A1 | * | 5/2009 | Okita | 228/102 |
| 2009/0321500 A1 | * | 12/2009 | Okada et al. | 228/119 |
| 2010/0288416 A1 | * | 11/2010 | Hamazaki | 156/60 |

\* cited by examiner

*Primary Examiner* — Kimberly Rizkallah
*Assistant Examiner* — Caleb Henry
(74) *Attorney, Agent, or Firm* — Scully, Scott, Murphy & Presser, P.C.; Louis J. Percello, Esq.

(57) ABSTRACT

A low thermal conductivity material layer covers a peripheral portion of the bottom surface of the conductive plate of a chip bonder head. The center portion of the conductive plate is exposed or covered with another conductive plate laterally surrounded by the low thermal conductivity material layer. During bonding, the chip bonder head holds a first substrate upside down and heats the first substrate through the conductive plate. Heating of a fillet, i.e., the laterally extruding portion, of a pre-applied underfill material is reduced because the temperature at the exposed surfaces of the low thermal conductivity material layer is lower than the temperature at the bottom surface of the conductive plate. The longer curing time and the more uniform shape of the fillet in the bonded structure enhance the structural reliability of the bonded substrates.

12 Claims, 13 Drawing Sheets

FLIP CHIP BONDER HEAD FOR FORMING A UNIFORM FILLET

BACKGROUND

The present disclosure relates to a bonder head for bonding chips, and particularly, to a bonder head configured to provide a uniform fillet and methods of operating the same.

A semiconductor chip can be bonded to another semiconductor chip or a packaging substrate by employing Controlled Collapse Chip Connection (C4) process. Each C4 ball contacts a C4 pad on the semiconductor chip and another C4 pad on the other semiconductor chip or the packaging substrate. Each C4 pad is a contiguous metal pad typically formed out of the last metal layer of a metal interconnect structure during a semiconductor manufacturing sequence. Each C4 pad is large enough to accommodate the bottom portion of a C4 ball. Typically, an array of C4 balls can be employed to provide input/output (I/O) connections between the semiconductor chip and another semiconductor chip or a packaging substrate.

The C4 connections are susceptible to mechanical stress created by a mismatch in the coefficients of thermal expansion (CTE's) between the semiconductor chip and the other semiconductor chip or the packaging substrate. Such mechanical stress may cause cracks in the C4 balls or the semiconductor chip, causing the semiconductor chip to fail during usage. An underfill material, which easily deforms under stress, i.e., has a low value of Young's modulus, is employed to fill the space around the array of the C4 balls between the semiconductor chip and the other semiconductor chip or the packaging substrate. The underfill material distributes the stress during the thermal expansion or contraction of the semiconductor chip, the array of C4 balls, and the other semiconductor chip or the packaging substrate, thereby preventing cracks in the bonded structure. In order to distribute the stress uniformly, however, it is necessary to have a uniform distribution of the underfill material.

Recently, processes that apply the underfill material on a semiconductor chip or on a packaging substrate have been proposed. These processes enable filling spaces between an array of C4 balls with fewer and/or smaller cavities by applying the underfill material either on the substrate to which C4 balls are attached or to the other substrate to which C4 balls are not attached at the beginning of the bonding process. See, for example, U.S. Pat. No. 6,746,896 to Shi et al. and U.S. Pat. No. 6,902,954 to Shi.

In the cases of wafer level underfill (WLU) or no flow underfill (NFU) known in the art, it is very difficult to get 100% good flip chip joints because the underfill material is easily entrapped between the chip bump and the substrate bump. The non-uniform flow of an underfill material out of chip area is the main reason why the underfill material is entrapped between bumps.

Figure 1:
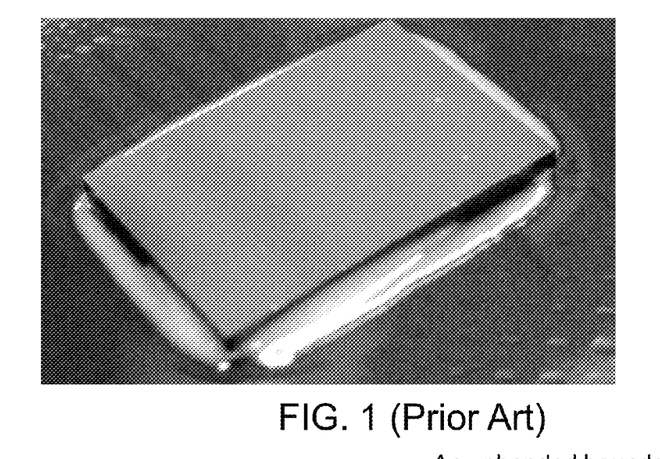
FIG. 1 is a photograph of a prior art bonded structure employing a pre-applied underfill material.

Referring to FIG. 1, a prior art bonded structure employs a pre-applied underfill material, i.e., an underfill material applied before the bonding of the C4 balls. The fillet of the underfill material, i.e., the portion of the underfill material that protrudes laterally beyond the sidewalls of the upper substrate, is not uniform. This non-uniformity is caused by rapid curing of the underfill material, which is exposed to radiation from peripheral portions of a bonding head that extend beyond the area of the underlying substrate. When the underfill material forms the fillet during bonding, the underfill material located in the outer chip area does not flow uniformly due to the direct radiation of heat from a bonder head.

Figure 2:
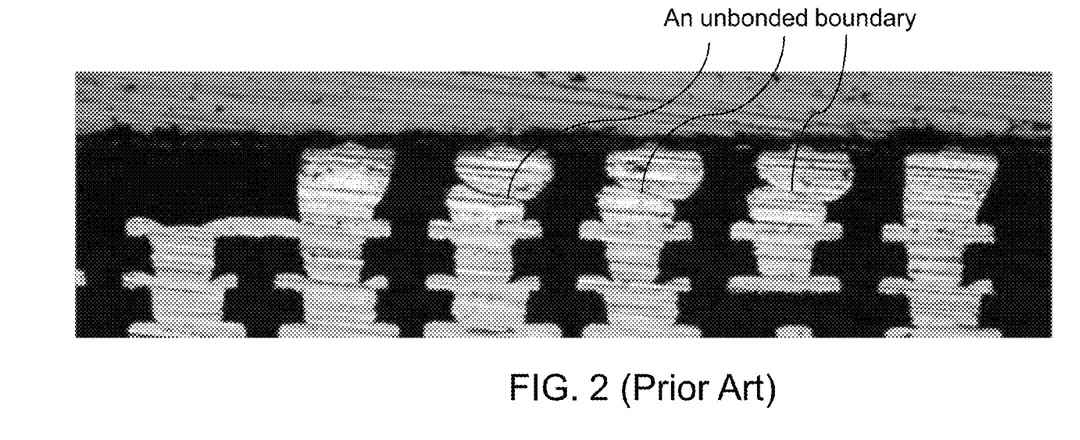
FIG. 2 is an optical micrograph of a cross-sectional area of a prior art bonded structure.

The rapid curing of the underfill material in the fillet reduces the ability of the underfill material to deform at the periphery of the C4 array as well as forming a non-uniform shape for the fillet. Thus, the prior art bonding process often produces irregular fillet shapes and insufficient flow of the underfill material in the outer chip area, and thereby making bad joints (with non-existent or insufficient electrical connection) where the underfill material is entrapped between bump. Referring to FIG. 2, the combination of the non-uniform shape of the fillet and the reduction in the deformability of the underfill material especially at the periphery of the C4 array can result in non-uniform and/or incomplete bonding of the C4 balls as illustrated by the presence of a boundary between a C4 ball and an underlying metallic material.

BRIEF SUMMARY

A chip bonder head includes a thermally conductive plate with a vacuum manifold embedded therein to hold a semiconductor chip upside down. A low thermal conductivity material layer having a thermal conductivity less than the thermal conductivity of the material of the conductive plate covers a peripheral portion of the bottom surface of the conductive plate, while the center portion of the conductive plate is exposed or covered with another conductive plate laterally surrounded by the low thermal conductivity material layer. During bonding of a first substrate to a second substrate, the chip bonder head holds the first substrate upside down and heats the first substrate through the conductive plate and, if present, through the other conductive plate. Heating of a fillet, i.e., the laterally extruding portion, of a pre-applied underfill material is reduced because the temperature at the exposed surfaces of the low thermal conductivity material layer is lower than the temperature at the bottom surface of the conductive plate. Consequently, the fillet of the underfill material is cured at a lower temperature over a longer period of time to form a uniform shape around the bonded substrate relative to a fillet formed by prior art chip bonder head operating at a similar temperature. The longer curing time and the more uniform shape of the fillet in the bonded structure provide a more uniform distribution of stress into the underfill material during thermal cycling of the bonded structure, thereby providing enhanced structural reliability for the bonded substrates.

According to an aspect of the present disclosure, a bonding apparatus for C4 bonding including a bonder head apparatus is provided. The bonder head apparatus includes: a conductive plate including a high thermal conductivity material having a thermal conductivity greater than 10 W/(m·K); a heater assembly configured to transmit heat to the conductive plate; and a low thermal conductivity material layer including at least one hole therein. The low thermal conductivity material layer covers at least a peripheral portion of a bottom surface of the conductive plate and does not cover at least one center portion of the bottom surface. The low thermal conductivity material layer includes a low thermal conductivity material having a thermal conductivity less than 10 W/(m·K).

According to another aspect of the present disclosure, a method of forming a bonded structure is provided, which includes: providing a bonding apparatus including a bonder head, which includes a conductive plate including a high thermal conductivity material having a thermal conductivity greater than 10 W/(m·K), a heater assembly configured to transmit heat to the conductive plate, and a low thermal conductivity material layer including at least one hole therein, wherein the low thermal conductivity material layer covers at least a peripheral portion of a bottom surface of the conductive plate and does not cover at least one center portion of the bottom surface, and the low thermal conductivity material layer includes a low thermal conductivity material having a thermal conductivity less than 10 W/(m·K); holding a first substrate under the at least one center portion, wherein an array of C4 balls is present on a bottom surface of the first substrate; placing a second substrate under the first substrate; and bonding the first substrate and the second substrate by soldering the array of C4 balls to the second substrate.

DETAILED DESCRIPTION

As stated above, the present disclosure relates to a bonder head configured to provide a uniform fillet and methods of operating the same, which are now described in detail with accompanying figures. It is noted that like and corresponding elements are referred to by like reference numerals. The drawings are not in scale.

Figure 3A:
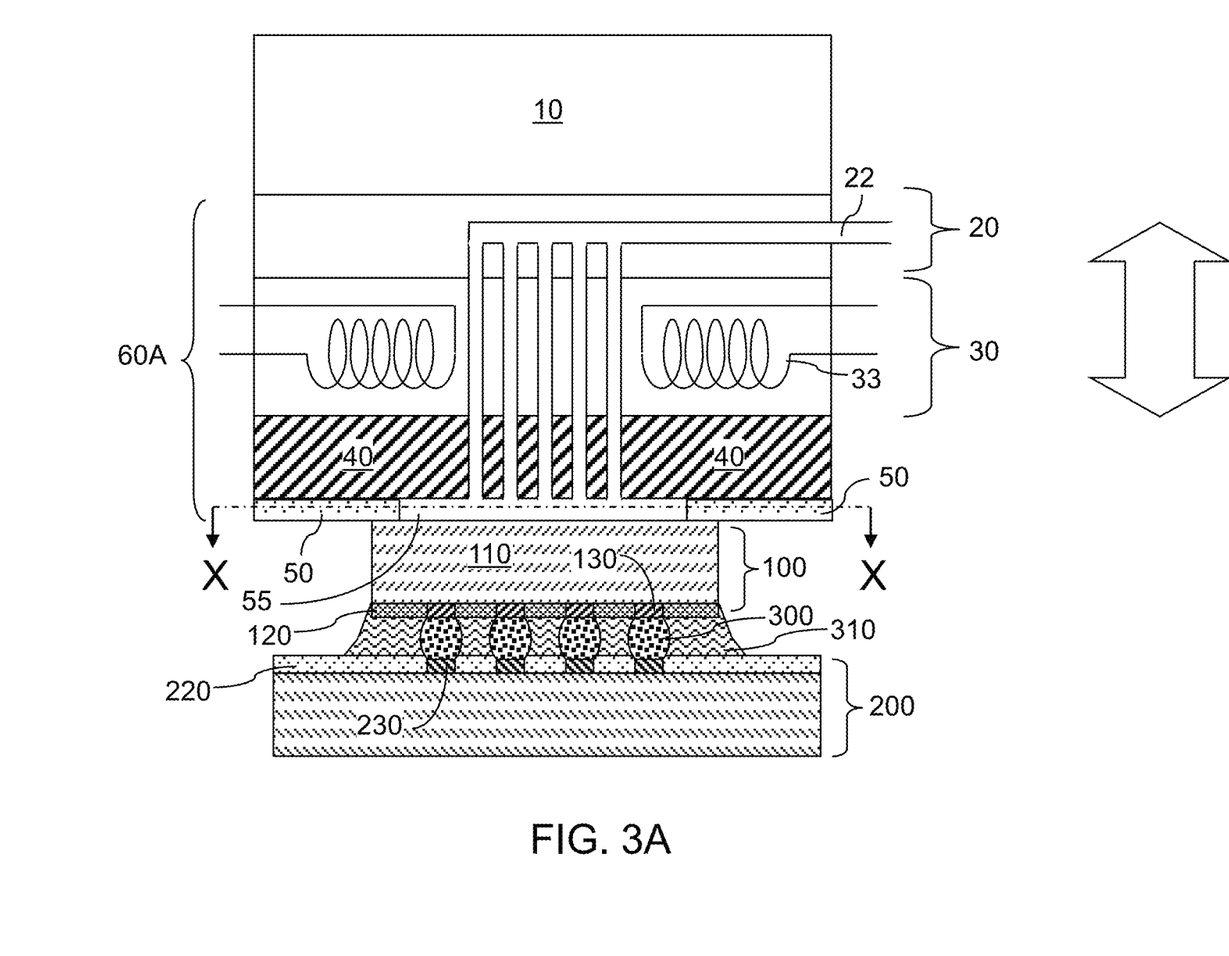
FIG. 3A is a schematic vertical cross-sectional view of a first exemplary structure including a first exemplary bonder head for C4 bonding, a first substrate, an array of C4 balls, an underfill material, and a second substrate according to a first embodiment of the present disclosure.
Figure 3B:
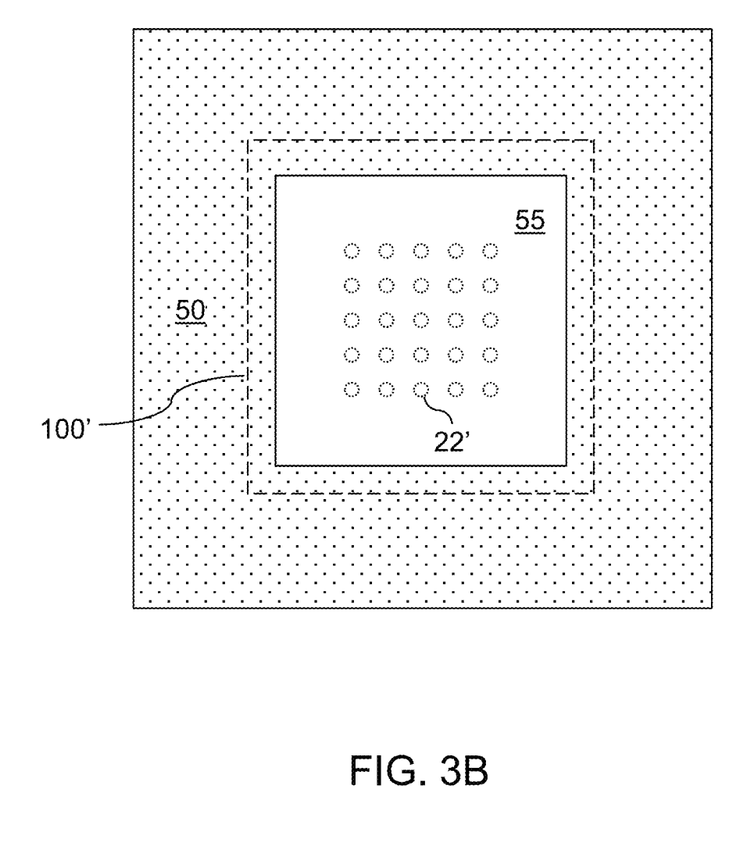
FIG. 3B is a horizontal cross-sectional view of the first exemplary structure along the plane X-X' in FIG. 3A according to the first embodiment of the present disclosure.

Referring to FIGS. 3A and 3B, a first exemplary structure includes a bonding apparatus including a first exemplary bonder head 60A that can be employed for C4 bonding, a movement actuator 10 configured to provide vertical movement of the first exemplary bonder head 60A, a first substrate 100, an array of C4 balls 300, an underfill material 310, a second substrate 200, and a fixture (not shown) that fixes the second substrate 200 at a fixed location and functions as a non-movable supporting structure to support non-moving components of the movement actuator 10. A back side of the first substrate 100 is attached to the bottom side of the first exemplary bonder head 60A by vacuum suction. The second substrate 200 is initially located beneath the first substrate 100 with sufficient vertical spacing from the first substrate 100 to enable placement of the array of C4 balls 300 and the underfill material 310 between the bottom surface of the first substrate 100 and the top surface of the second substrate 200.

The first substrate 100 can be a semiconductor chip including a semiconductor-device-containing portion 110, a first surface dielectric layer 120, and an array of first C4 pads 130 embedded within the first surface dielectric layer 120. Each C4 pad within the array of first C4 pads 130 can be electrically connected to at least one semiconductor device within the semiconductor-device-containing portion 110 through metal interconnect structures (not shown) embedded in the semiconductor-device-containing portion 110. The semiconductor-device-containing portion 110 includes semiconductor devices that can be, for example, field effect transistors, bipolar transistors, diodes, and/or optical semiconductor devices. The first substrate 100 is held upside down by the first exemplary bonder head 60A so that an exposed surface of the first surface dielectric layer 120 is located at the bottommost portion of the first substrate 100.

The second substrate 200 can be another semiconductor chip or a packaging substrate. If the second substrate 200 is another semiconductor chip, the second substrate 200 includes semiconductor devices therein. If the second substrate 200 is a packaging substrate, the second substrate 200 includes layers of wiring structures (metal interconnect structures), and can be a ceramic substrate or a laminate substrate. The second substrate 200 can include a second surface dielectric layer 220 and an array of second C4 pads 230 embedded within the second surface dielectric layer 220. Each C4 pad within the array of second C4 230 pads can be electrically connected to the layers of wiring within the second substrate 200. The first substrate 200 is held upright so that an exposed surface of the second surface dielectric layer 220 is located at the topmost portion of the first substrate 200 and faces the bottommost surface of the first substrate 100.

The second substrate 200 can be held at a fixed location by a fixture (not shown). A movement actuator 10, located on the first exemplary bonder head 60A, can operate to enable the vertical movement of the first exemplary bonder head 60A and the first substrate 100 relative to the fixture and the second substrate 200 fixed thereto. The bidirectional arrow represents the direction of movement for the first exemplary bonder head 60A. The movement actuator 10 is configured to provide upward and downward vertical movement of the first exemplary bonder head 60A relative to the fixture.

The array of C4 balls 300 are typically attached to the array of first C4 pads 130 prior to mounting on the first exemplary bonder head 60A employing methods known in the art. The underfill material 310 can be applied over the array of C4 balls 300 before mounting the first substrate 100 on the first exemplary bonder head 60A while the substrate 100 is held upright. Alternately, the underfill material 310 can be applied over the array of second C4 pads 230 before mounting the second substrate 200 on the fixture. The spacing between the bottom surface of the first substrate 100 and the top surface of the second substrate 200 is greater than the thickness of the combination of the array of C4 balls 300 and the underfill material at the time of mounting of the first and second substrates (100, 200), and is subsequently reduced during the bonding of the first and second substrates (100, 200).

The first exemplary bonder head 60A includes a conductive plate 40, a heater assembly 30 that includes at least one heating coil 33, a substrate support mechanism 20, and a low thermal conductivity material layer 50 located on a peripheral portion of the bottom surface of the conductive plate 40. The conductive plate 40 includes a "high thermal conductivity material," which refers to a material having a thermal conductivity greater than 10 W/(m·K) as used herein. Preferably, the thermal conductivity of the material of the conductive plate is greater than 100 W/(m·K). Examples of the high thermal conductivity material include, but are not limited to, an elemental metal, an alloy of elemental metals, and a conductive metallic alloy of at least one elemental metal and a non-metallic element such as nitrogen and/or oxygen. For example, the high thermal conductivity material of the conductive plate 40 can be diamond (having a thermal conductivity between 900 W/(m·K) and 2,300 W/(m·K)), silver (having a thermal conductivity about 429 W/(m·K)), copper (having a thermal conductivity about 401 W/(m·K)), gold (having a thermal conductivity about 318 W/(m·K)), aluminum (having a thermal conductivity about 237 W/(m·K)), silicone carbide (having a thermal conductivity about 200 W/(m·K)), aluminum nitride (having a thermal conductivity about 150 W/(m·K)), alumina (having a thermal conductivity about 32 W/(m·K)), silicone nitride (having a thermal conductivity about 30~150 W/(m·K)), or a combination thereof.

The heater assembly 30 is configured to generate and transmit heat to the conductive plate 40 by conduction and/or radiation and/or convection. Typically, the heater assembly 30 is configured to transmit heat to the conductive plate 40 by conduction. The at least one heating coil 33 is electrically connected to an electrical power source (not shown) that provides electrical power in the form of direct current (DC) or alternate current (AC).

The substrate support mechanism 20 holds the first substrate 100 upside down. The substrate support mechanism 20 can include a vacuum manifold 22 that extends through the conductive plate and to at least one hole located on the bottom surface of the conductive plate 40. The opposite end of the vacuum manifold 22 includes at least one vacuum connection port that is configured to be connected to a vacuum pump. The vacuum suction provided to the back side of the first substrate 100 can mechanically support the first substrate 100. Alternately, any other substrate support mechanism 20 that is capable of mechanically supporting the first substrate 100 can be employed instead of the substrate support mechanism employing vacuum pumping. Such other substrate support mechanisms include clips and/or temporary adhesive materials.

The low thermal conductivity material layer 50 includes a hole therein. Thus, the low conductivity material layer 50 is not present under a center portion of the conductive plate 40. Thus, the low thermal conductivity material layer 50 covers at least a peripheral portion of the bottom surface of the conductive plate 40, but does not cover the center portion of the bottom surface of the conductive plate 40. The bottom surface of the conductive plate 40 is planar, i.e., the exposed portion of the bottom surface of the conductive plate 40 and the interface between the low thermal conductivity material layer 50 and the conductive plate 40 are within a same horizontal plane. Upon mounting of the first substrate 100, a cavity 55 laterally surrounded by the low thermal conductivity material layer 50 is present under the center portion of the bottom surface of the conductive plate 40, i.e., under a single contiguous portion of the bottom surface of the conductive plate 40. The first substrate 100 is held under the cavity 55, which is located under the center portion of the conductive plate 40.

The low thermal conductivity material layer 50 includes a "low thermal conductivity material," which refers to a material having a thermal conductivity less than 10 W/(m·K) as used herein. Preferably, the material of the low thermal conductivity material layer 50 has a thermal conductivity less than 1.0 W/(m·K). The material of the low thermal conductivity material layer 50 can be, but is not limited to, a dielectric material that has an electrical resistivity greater than 1 Ω-m. Correspondingly, the low thermal conductivity material layer 50 can be, but does not need to be, a dielectric material layer. The thickness of the low thermal conductivity material layer 50 can be from 25 microns to 3 cm, and typically from 100 microns to 1 cm, although lesser and greater thicknesses can also be employed.

The material of the low thermal conductivity material layer 50 can be, but is not limited to, a polymer, a resin, or a combination thereof. For example, the low thermal conductivity material layer is composed of polyimide such as Kapton® developed and commercially sold by DuPont™. The thermal conductivity of Kapton®, type 100 HN film, 25 microns thick, is about 0.12 W/(m·K).

The first exemplary bonder head 60A is configured to hold the first substrate 100 upside down under the horizontal plane of the bottommost surface of the low thermal conductivity material layer 50. Because the periphery of the bottom surface of the conductive plate 40 is covered with the low thermal conductivity material layer 50, the low thermal conductivity material layer 50 retards conduction of heat from the heater assembly 30 to the bottom surface of the low thermal conductivity material layer 50. Consequently, the temperature of the bottom surface of the low thermal conductivity material layer 50 is lower than the temperature at the bottom surface of the conductive plate 40. Even after accounting for the difference of temperature between the back side surface (located at the top when held upside down) of the first substrate 100 and the temperature at the bottom surface of the conductive plate 40, the temperature of the low thermal conductivity material layer 50 can be lower than the temperature at the back side surface of the first substrate 100. This temperature differential can be increased even more by reducing the contact area between the bottom surface of the conductive plate 40 and the top surface of the low thermal conductivity material layer 50, for example, by providing a rough surface for the peripheral portion of the bottom surface of the conductive plate, by providing a rough surface for the top surface of the low thermal conductivity material layer 50, by providing an air gap (not shown) with dielectric spacers (not shown) therebetween, or a combination thereof.

Because of the presence of the cavity 55, the top surface of the first substrate 100 and the bottom surface of the low thermal conductivity material layer 50 are vertically offset from the bottom surface of the conductive plate 40 by the thickness of the low thermal conductivity material layer 50. The heater assembly 30 can be configured as a replaceable element such that the heater assembly 30 can be replaced with a new heater assembly when a different type of semiconductor chips is to be bonded to a substrate after completing the bonding of one type of semiconductor chips.

Figure 4A:
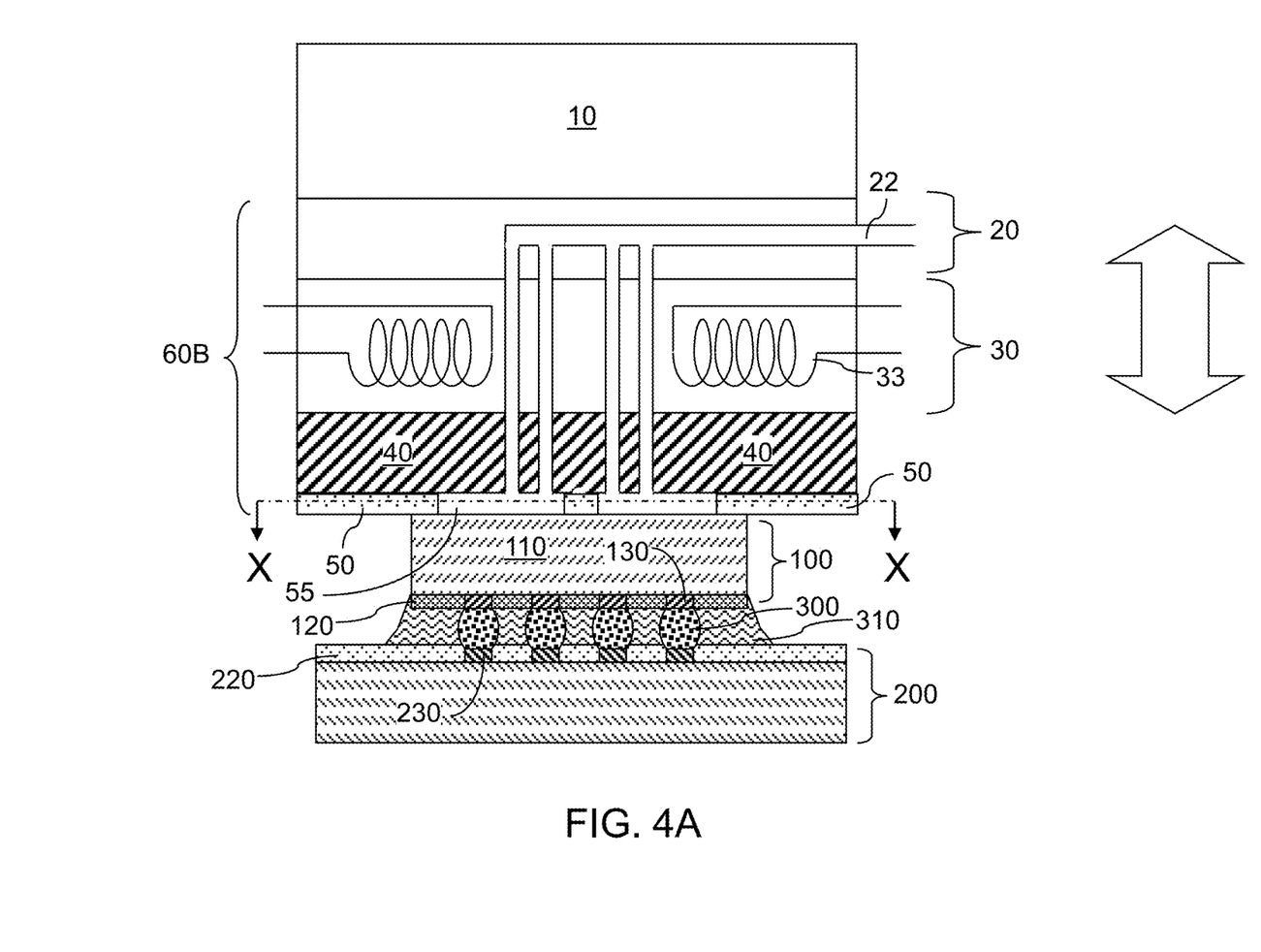
FIG. 4A is a schematic vertical cross-sectional view of a second exemplary structure including a second exemplary bonder head for C4 bonding, a first substrate, an array of C4 balls, an underfill material, and a second substrate according to a second embodiment of the present disclosure.
Figure 4B:
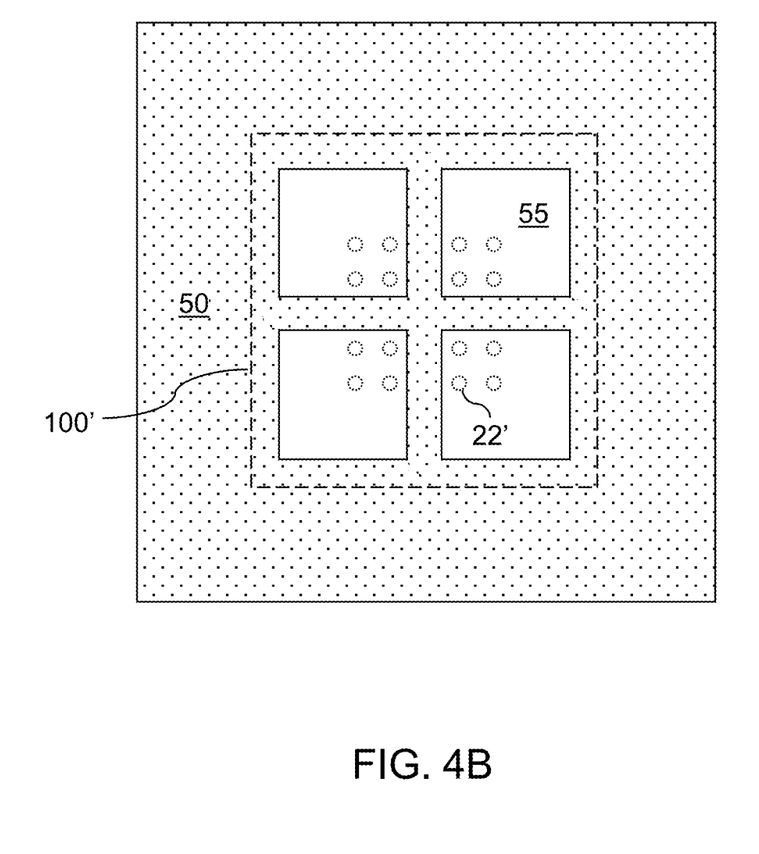
FIG. 4B is a horizontal cross-sectional view of the second exemplary structure along the plane X-X' in FIG. 4A according to the second embodiment of the present disclosure.

Referring to FIGS. 4A and 4B, a second exemplary structure according to a second embodiment of the present disclosure can be derived from the first exemplary structure by replacing the first exemplary bonder head 60A with a second exemplary bonder head 60B. In the second exemplary structure, the low thermal conductivity material layer 50 of the first exemplary bonder head 60A is modified to include a plurality of holes therein. The bottom surface of the conductive plate 40 is planar as in the first exemplary bonder head 60A. A center portion of the bottom surface of the conductive plate 40 is present above each hole in the low thermal conductivity material layer 50.

Upon mounting of the first substrate 100, a cavity 55 laterally surrounded by the low thermal conductivity material layer 50 is present under each of the plurality of center portions of the bottom surface of the conductive plate 40 and above the first substrate 100. The first substrate 100 does not contact the bottom surface of the conductive plate 40 while the first substrate 100 is held under the center portions of the conductive plate 40. The low thermal conductivity material layer 50 contacts the entirety of a periphery of the first substrate 100 as well as some center portions of the first substrate 100 while the first substrate 100 is held under the exposed center portions of the bottom surface of the conductive plate 40. The holes at the end of the vacuum manifold 22 are placed on the exposed portions of the bottom surface of the conducive plate 40 so that vacuum suction can be provided to each cavity 55 and the first substrate 100 can be held in place.

Figure 5A:
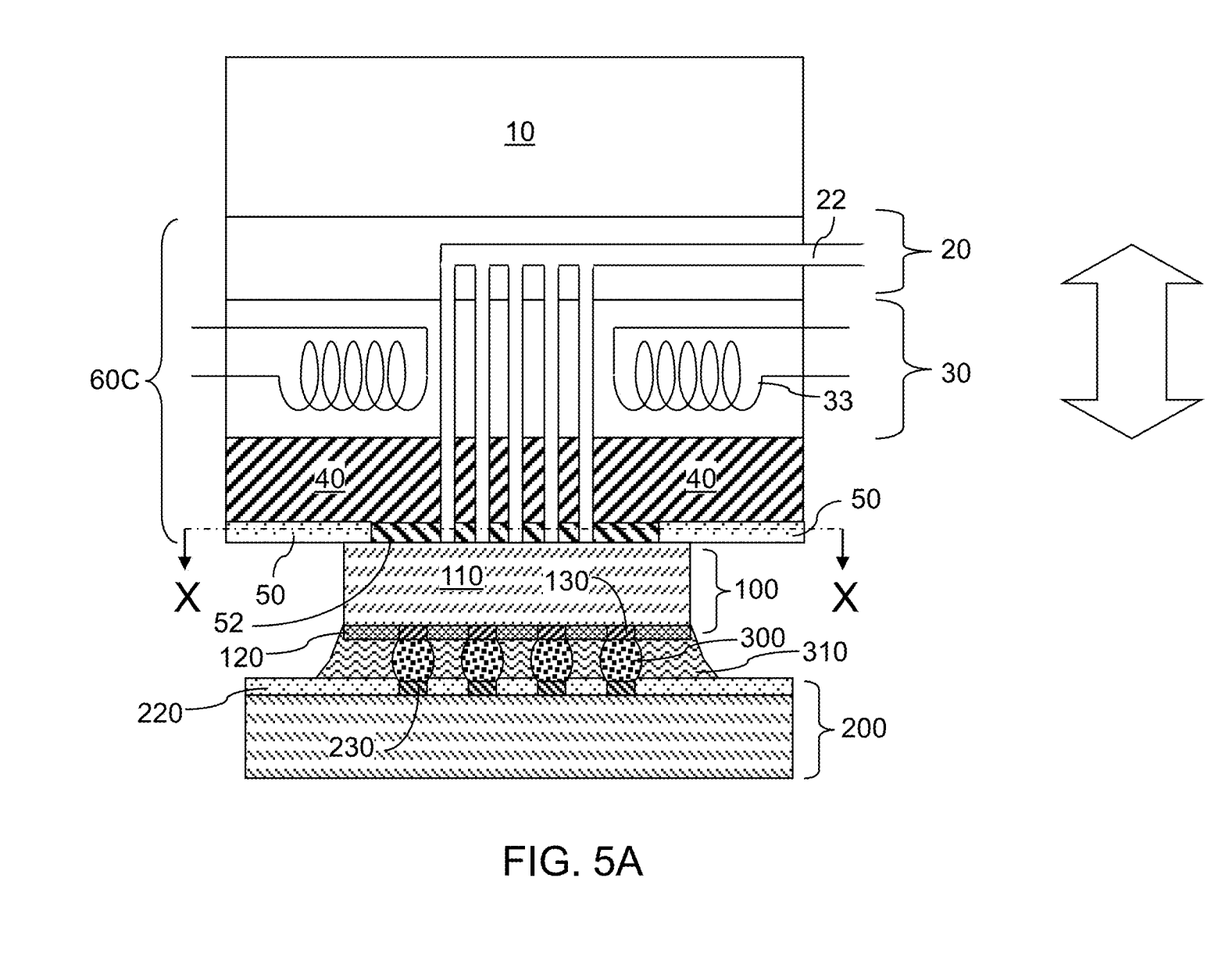
FIG. 5A is a schematic vertical cross-sectional view of a third exemplary structure including a third exemplary bonder head for C4 bonding, a first substrate, an array of C4 balls, an underfill material, and a second substrate according to a third embodiment of the present disclosure.
Figure 5B:
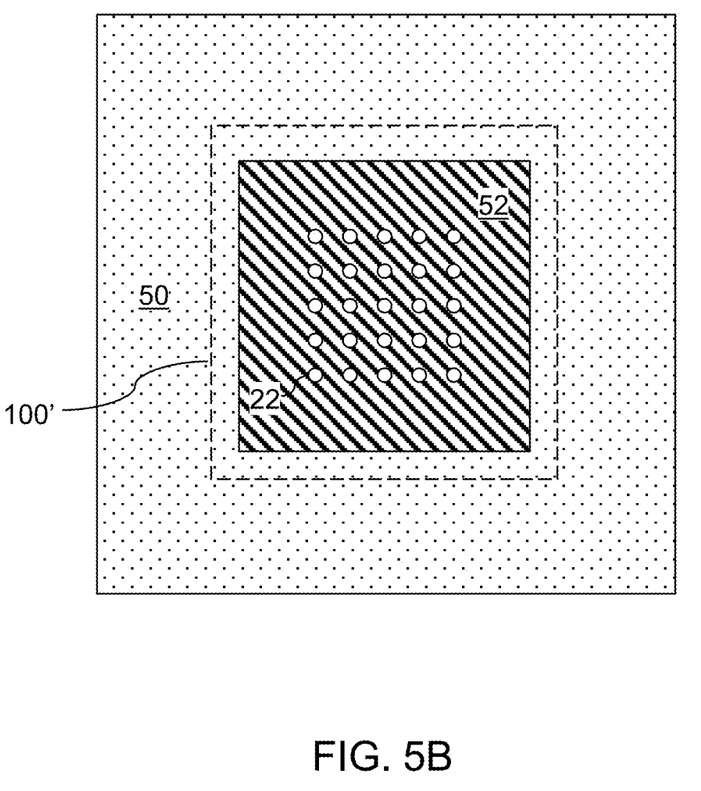
FIG. 5B is a horizontal cross-sectional view of the third exemplary structure along the plane X-X' in FIG. 5A according to the third embodiment of the present disclosure.

Referring to FIGS. 5A and 5B, a third exemplary structure according to a third embodiment of the present disclosure can be derived from the first exemplary structure by replacing the first exemplary bonder head 60A with a third exemplary bonder head 60C. Specifically, an extension conductive plate 52 is added into the hole in the low thermal conductivity material layer 50. The extension conductive plate 52 can be a separate structure that is held to the center portion of the bottom surface of the conductive plate 40 through mechanical components (screws, bolts, etc.), or can be incorporated into the conductive plate 40 as an integral structure, i.e., the conductive plate 40 and the extension conductive plate 52 can be of integral construction and constitute a single mechanically contiguous component. The thickness of the extension conductive plate 52 can be substantially the same as, greater than, or less than, the thickness of the low thermal conductivity material layer 50.

The extension conductive plate 52 is a conductive plate including a high thermal conductivity material. Preferably, the material of the extension conductive plate 52 has a thermal conductivity greater than 100 W/(m·K). Any high thermal conductivity material that can be employed for the conductive plate 40 can be employed for the extension conductive plate 52. For example, the material of the extension conductive plate 52 can be diamond, silver, copper, gold, aluminum, or a combination thereof.

The extension conductive plate 52 contacts the single center portion of the bottom surface of the conductive plate 40, and is laterally surrounded by the low thermal conductivity material layer 50. The first substrate 100 contacts the bottom surface of the extension conductive plate 52, and may, or may not, contact inner edge surfaces of the low thermal conductivity material layer 50 depending on the relative thicknesses of the extension conductive plate 52 and the low thermal conductivity material layer 50.

If the conductive plate 40 and the extension conductive plate 52 are two separate elements, the first substrate 100 does not contact the bottom surface of the conductive plate 40 while the first substrate 100 is held under the center portion of the conductive plate 40. Further, low thermal conductivity material layer 50 can contact a periphery of the first substrate and the first substrate 100 can contact the bottom surface of the extension conductive plate 52 while the first substrate 100 is held under the center portion of the conductive plate 40.

Figure 6A:
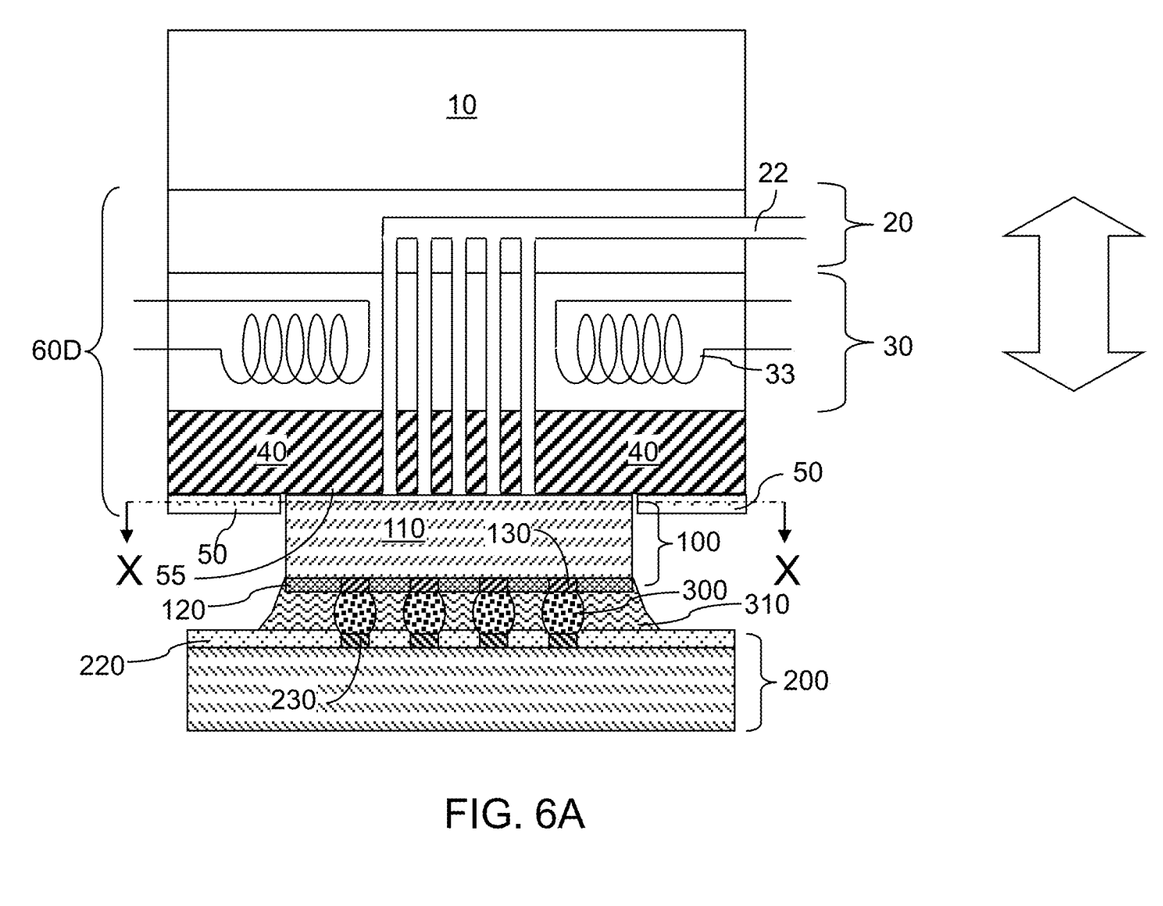
FIG. 6A is a schematic vertical cross-sectional view of a fourth exemplary structure including a fourth exemplary bonder head for C4 bonding, a first substrate, an array of C4 balls, an underfill material, and a second substrate according to fourth embodiment of the present disclosure.
Figure 6B:
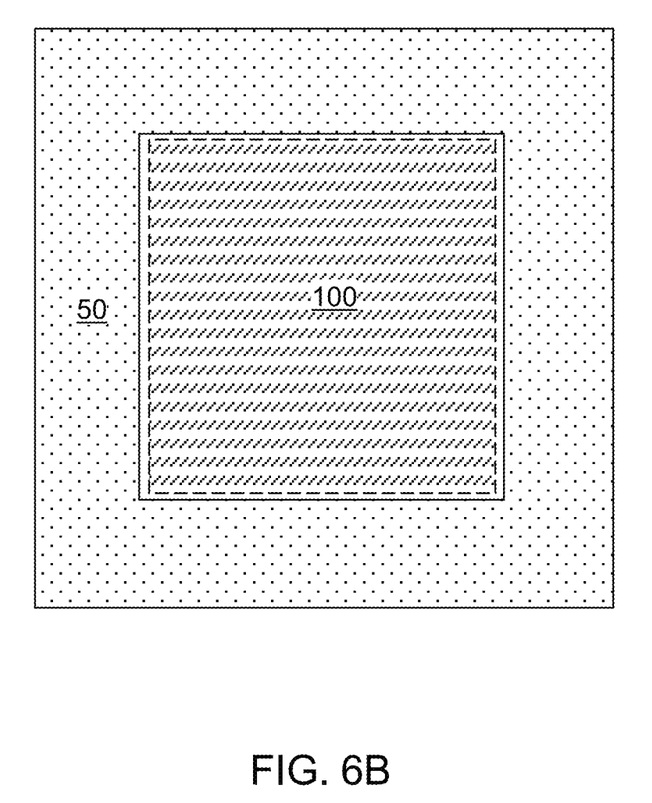
FIG. 6B is a horizontal cross-sectional view of the fourth exemplary structure along the plane X-X' in FIG. 6A according to the fourth embodiment of the present disclosure.

Referring to FIGS. 6A and 6B, a fourth exemplary structure according to a fourth embodiment of the present disclosure can be derived from the first exemplary structure by replacing the first exemplary bonder head 60A with a fourth exemplary bonder head 60D. Specifically, the width of the low thermal conductivity material layer 50 is changed along the periphery of the conductive plate 40. A single hole large enough and shaped to accommodate the first substrate 100 is present in the low thermal conductivity material layer 50. The single hole is present under a single center portion of the conductive plate 40.

Upon mounting of the first substrate 100, the back side surface (the upper surface as held upside down) of the first substrate 100 contacts the center portion of the bottom surface of the conductive plate 40. Thus, the transfer of heat from the heater assembly 30 to the first substrate 100 can be enhanced in this configuration, while thermal radiation from the periphery of the bottom surface of the conductive plate 40 is significantly decreased by suppression of heat transfer to the bottom surface of the low thermal conductivity material layer 50 due to the low thermal conductivity thereof.

In all of the above embodiments, a material having a low emissivity may be selected for the low thermal conductivity material layer 50 to further reduce radiation of heat from the bottom surface of the low thermal conductivity material layer 50. Further, an opaque material can be selected for the low thermal conductivity material layer 50 to reduce the thermal radiation from the peripheral portion of the conductive plate 40 through the low thermal conductivity material layer 50.

Figure 7A:
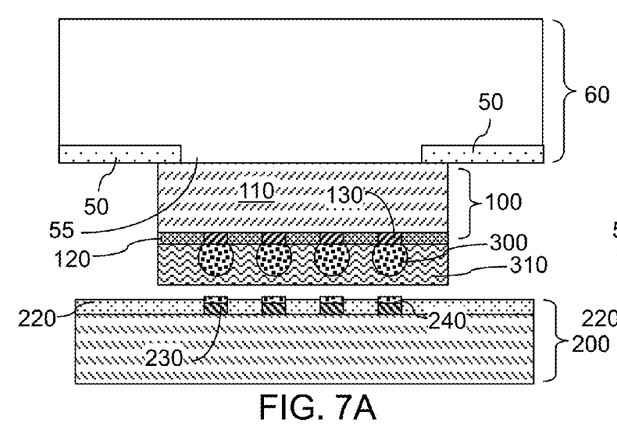
FIGS. 7A-7F are sequential schematic vertical cross-sectional views of an exemplary structure illustrating a first method of bonding substrates according to an embodiment of the present disclosure.

Referring to FIGS. 7A-7F, a first method of bonding substrates according to an embodiment of the present disclosure is sequentially illustrated. Referring to FIG. 7A, a bonder head 60 according to the present disclosure can be any of the first through fourth exemplary bonder heads (60A, 60B, 60C, 60D) described above. First, a first substrate 100 including a semiconductor-device-containing portion 110, and a first surface dielectric layer 120, and an array of first C4 pads 130 is provided. An array of C4 balls 300 is attached to the array of first C4 pads 130 employing methods known in the art. Subsequently, a fill material 310 is applied over the array of C4 balls 300 on a front surface, which is a bottom surface (as seen with the first substrate 100 upside down in FIG. 7A) of the first substrate 100, i.e., the exposed surface of the first surface dielectric layer 120. For example, the fill material 310 can be over bump applied resin (OBAR) as known in the art, and the thickness of the fill material 310 can be greater than the height of the array of C4 balls by an additional thickness from 5 microns to 50 microns. The first substrate 100 is then held upside down over a second substrate 200.

The second substrate 200 can be another semiconductor chip or a packaging substrate. The second substrate 200 can include a second surface dielectric layer 220 and an array of second C4 pads 230 embedded within the second surface dielectric layer 220. A solder material portion 240, which can have the same composition as the array of C4 balls 300, can be applied to each second C4 pad 230.

The second substrate 200 is placed under the first substrate 100 either by moving the first substrate 100 or by moving the second substrate 200. In one embodiment, the second substrate 200 can be directly mounted to a fixture, and the first substrate 100 may be mounted to the bonder head 60, which can move vertically and/or laterally by a movement actuator 10 (See FIGS. 3A, 4A, 5A, 6A). Alternately or in conjunction, the second substrate 200 can be mounted in a way that enables lateral movement of the second substrate 200. The first substrate 100 and/or the second substrate 200 are moved relative to each other so that a C4 ball 300 directly overlies a corresponding solder material portion 240 and a corresponding second C4 pad 230. Any alignment scheme known in the art can be employed so that components in each pair of a C4 ball 300 and a corresponding second C4 pad overlie or underlie each other. A finite vertical spacing is maintained between the bottom surface of the underfill material 310 and the topmost surfaces of the solder material portions 240 until the alignment of the first and second substrates (100, 200) relative to each other is complete.

Depending on the configuration of the bonder head 60, the first substrate 100 may, or may not, contact a conductive plate 40 (See FIGS. 3A, 4A, 5A, 6A). Specifically, if the bonder head 60 is one of the first exemplary bonder head 60A, a second exemplary bonder head 60B, or a third exemplary bonder head 60C, the first substrate 10 does not contact the bottom surface of the conductive plate 40 while the first substrate 100 is held under the at least one center portion of the bottom surface of the conductive plate 40 (See FIGS. 3A, 4A, 5A). Further, the low thermal conductivity material layer 50 may contact a periphery of the first substrate 100 while the first substrate 100 is held under the at least one center portion of the bottom surface of the conductive plate 40. If the bonder head 60 is a fourth exemplary bonder head 60D, the first substrate 100 contacts the bottom surface of the conductive plate 40 while the first substrate 100 is held under the center portion of the bottom surface of the conductive plate 40 (See FIG. 6A).

Figure 7B:
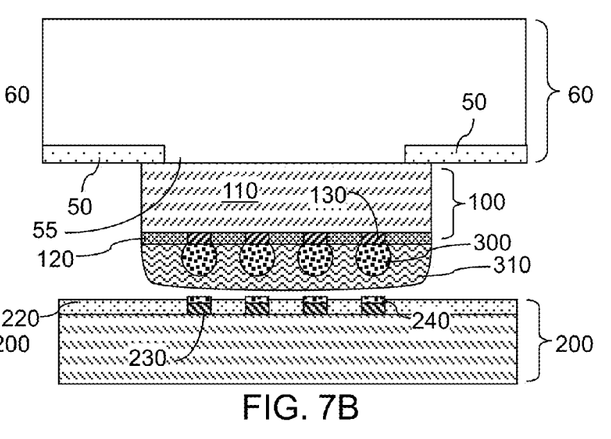

Referring to FIG. 7B, the array of C4 balls 300 is raised to an elevated temperature not exceeding the melting temperature of the material of the C4 balls 300. The temperature of the array of C4 balls 300 can be raised by applying heat from a heater assembly 30 (See FIGS. 3A, 4A, 5A, 6A) through a conductive plate 40 to the first substrate 100, which transmits the heat to the array of C4 balls 300 and the underfill material 310. As the temperature of the underfill material increases, the outer surfaces of the underfill material may develop a convex shape due to a decrease in viscosity and the effect of surface tension.

Figure 7C:
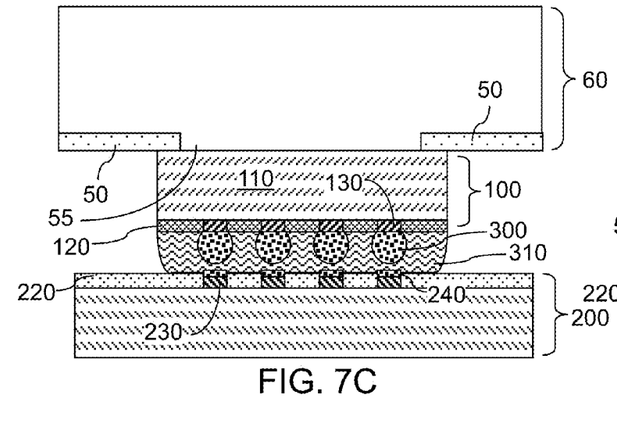

Referring to FIG. 7C, the first and second substrates (100, 200) are moved closer to each other until a surface of the underfill material 310 contacts the topmost surface of the second substrate 200. The relative movement of the first and second substrates (100, 200) can be effected by a vertical downward movement of the first substrate 100, a vertical upward movement of the second substrate 200, or a combination thereof. Initially, the array of C4 balls 300 does not make a contact with the solder material portions 240 located on the second substrate 200.

Figure 7D:
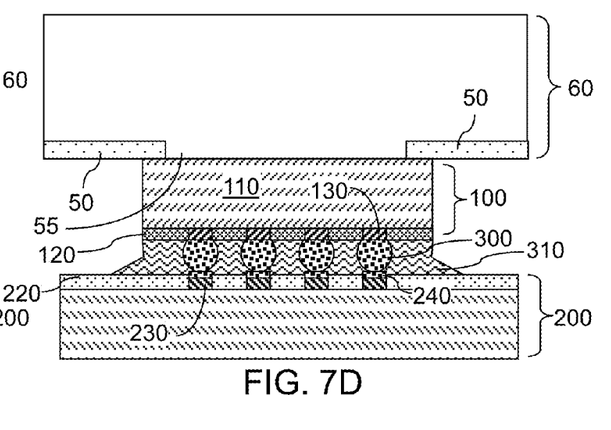

Referring to FIG. 7D, the first and second substrates (100, 200) are moved even closer to each other until the array of C4 balls 300 contact the second substrate 200, i.e., the solder material portions 240 of the second substrate 200.

Figures 7E, 7F:
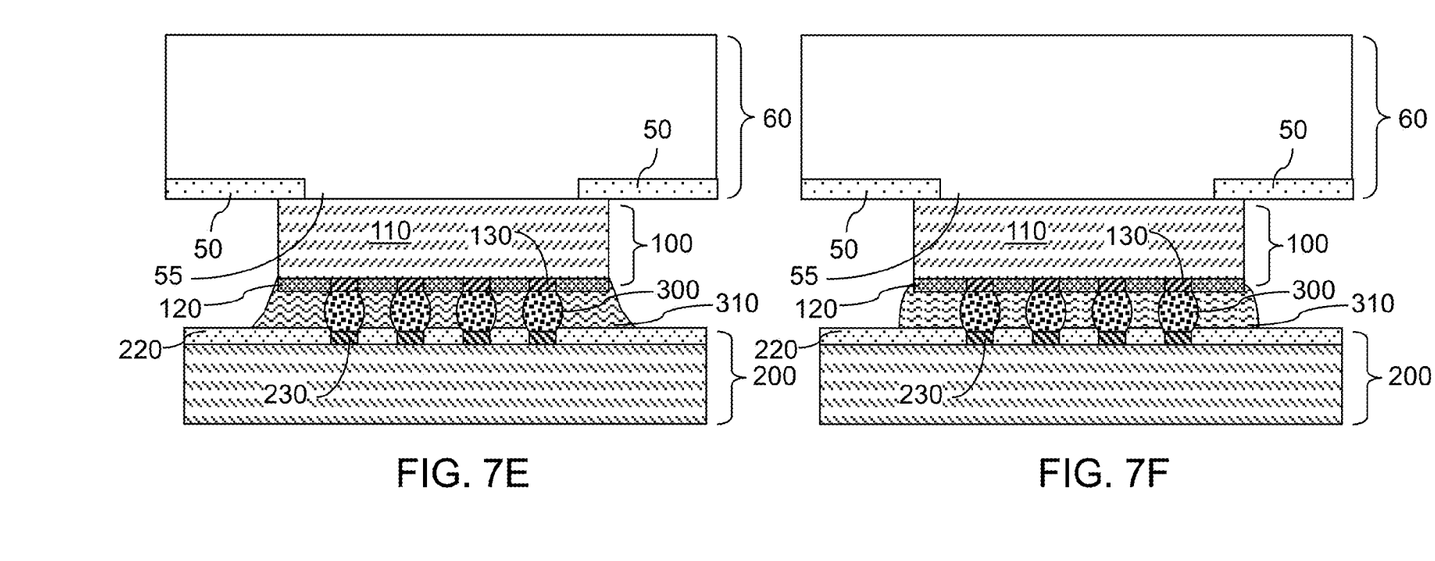

Referring to FIG. 7E, once the array of C4 balls 300 contact the second substrate 200, the array of C4 balls 300 is further heated to a reflow temperature of the solder material of the C4 balls 300 and the solder material portions 240. Upon heating of the array of C4 balls 300 to the reflow temperature of the solder material therein, the solder material of the C4 balls 300 and the solder material of the solder material portions 240 on the second substrate 200 begin to reflow, and the material of each solder material portion 240 is incorporated into a C4 ball 300. Upon reflow of the array of C4 balls 300, the first substrate 100 can be moved closer to the second substrate 200 to more effectively incorporate the material of the solder material portions 240 and to increase the solder bonding areas.

Referring to FIG. 7F, the first substrate 100 can be moved away from the second substrate 200 after the moving of the first substrate 100 closer to the second substrate 200 to provide desired solder joints height and an optimal and uniform shape for a fillet of the underfill material 310, i.e., for the portion of the underfill material 310 that laterally extrudes away from the sidewalls of the first substrate 100. Thus, the first and second substrates (100, 200) are bonded through the array of C4 balls 310 and the underfill material 310.

The presence of the low thermal conductivity material layer 50 around the periphery of the first substrate 100 reduces the amount of heat radiated onto the extruding portions of the underfill material throughout the steps of FIGS. 7B-7F. In other words, the low temperature at the bottom surface of the low thermal conductivity material layer 50 has the effect of reducing direct heat radiation from the surface of the low thermal conductivity material layer 50 to the portion of the underfill material 310 which extrudes laterally from between the first substrate 100 and the second substrate 200 during the bonding of the first and second substrates (100, 200). The reduction in the direct radiation is apparent compared with prior art bonder heads that do not include any low thermal conductivity material layer underneath a conductive plate. By employing the bonder apparatus disclosed herein, the quality of solder joints can be improved and a uniform fillet can be formed by reducing the direct radiation to the fillet and causing the fillet to cure for a longer curing time at a lower temperature than otherwise achievable according to prior art methods.

Figure 8A:
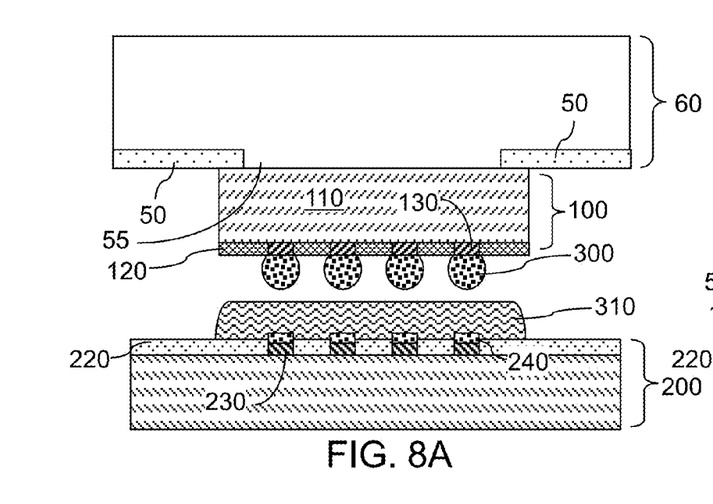
FIGS. 8A-8D are sequential schematic vertical cross-sectional views of another exemplary structure illustrating a second method of bonding substrates according to another embodiment of the present disclosure.

Referring to FIGS. 8A-8D, a second method of bonding substrates according to another embodiment of the present disclosure is sequentially illustrated. Referring to FIG. 8A, a bonder head 60 according to the present disclosure can be any of the first through fourth exemplary bonder heads (60A, 60B, 60C, 60D) described above. The first substrate 100, the second substrate 200, and the array of C4 balls 300 are the same as in the first method illustrated in FIGS. 7A-7F. A fill material 310 is applied over the solder material portions 240 on the second substrate 200. The fill material 310 can have the same composition and thickness as in the first method illustrated in FIGS. 7A-7F.

The first substrate 100 is then held upside down over a second substrate 200. The second substrate 200 is placed under the first substrate 100 either by moving the first substrate 100 or by moving the second substrate 200 in the same manner as in the first method.

Figure 8B:
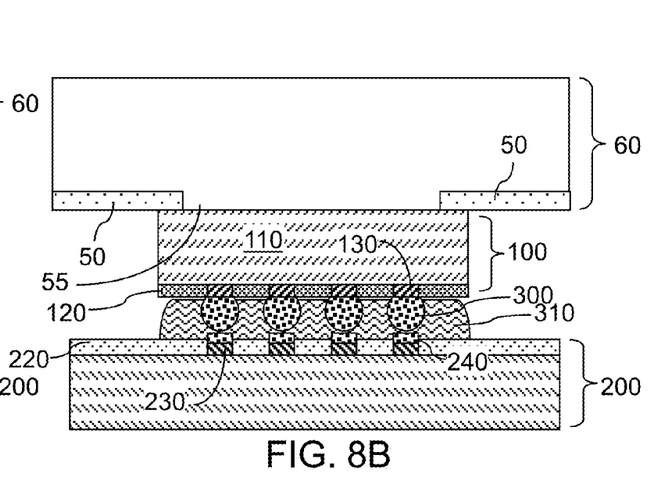

Referring to FIG. 8B, the array of C4 balls 300 is raised to an elevated temperature not exceeding the melting temperature of the material of the C4 balls 300. The temperature of the array of C4 balls 300 can be raised by applying heat from a heater assembly 30 (See FIGS. 3A, 4A, 5A, 6A) through a conductive plate 40 to the first substrate 100, which transmits the heat to the array of C4 balls 300. The first and second substrates (100, 200) are moved closer to each other until the array of C4 balls 300 contact the second substrate 200, i.e., the solder material portions 240 of the second substrate 200.

Figure 8C:
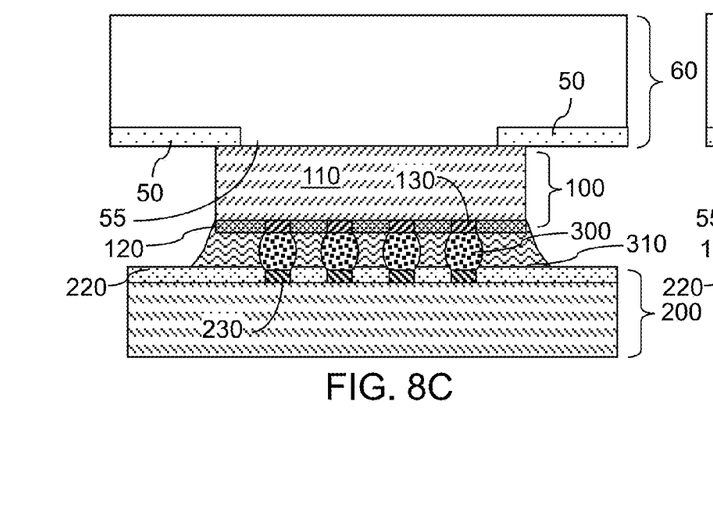

Referring to FIG. 8C, once the array of C4 balls 300 contact the second substrate 200, the array of C4 balls 300 is further heated to a reflow temperature of the solder material of the C4 balls 300. Upon heating of the array of C4 balls 300 to the reflow temperature of the solder material therein, the solder material of the C4 balls 300 and the solder material of the solder material portions 240 on the second substrate 200 begin to reflow, and the material of each solder material portion 240 is incorporated into a C4 ball 300. Upon reflow of the array of C4 balls 300, the first substrate 100 can be moved closer to the second substrate 200 to more effectively incorporate the material of the solder material portions 240 and to increase the solder bonding areas.

Figure 8D:
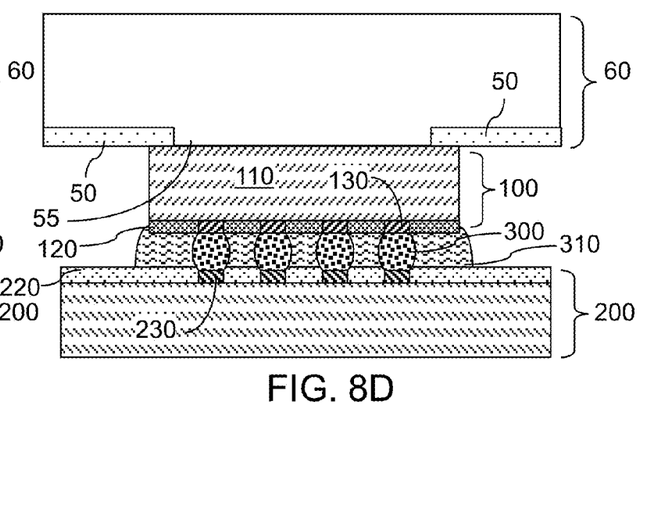

Referring to FIG. 8D, the first substrate 100 can be moved away from the second substrate 200 after the moving of the first substrate 100 closer to the second substrate 200 to provide desired solder joints height and an optimal and uniform shape for a fillet of the underfill material 310, i.e., for the portion of the underfill material 310 that laterally extrudes away from the sidewalls of the first substrate 100. Thus, the first and second substrates (100, 200) are bonded through the array of C4 balls 310 and the underfill material 310.

As in the first method, the presence of the low thermal conductivity material layer 50 around the periphery of the first substrate 100 reduces the amount of heat radiated onto the extruding portions of the underfill material throughout the steps of FIGS. 8B-8D. By employing the bonder apparatus disclosed herein, the quality of solder joints can be improved and a uniform fillet can be formed by reducing the direct radiation to the fillet and causing the fillet to cure for a longer curing time at a lower temperature than otherwise achievable according to prior art methods.

Figure 9:
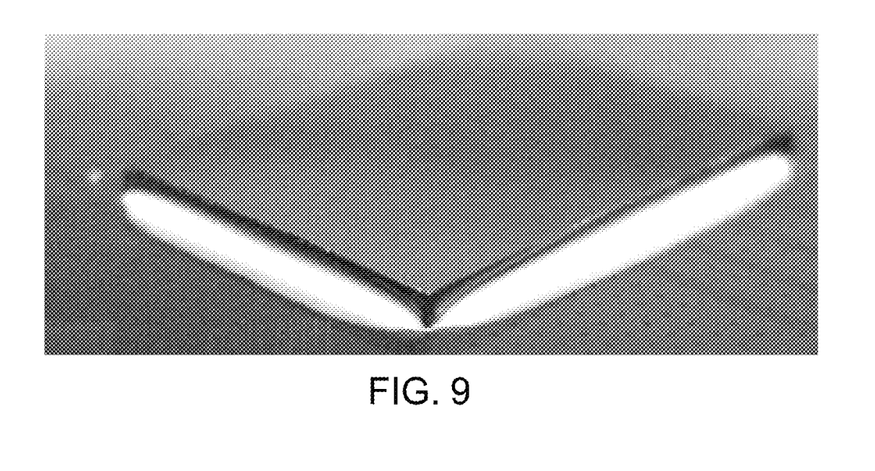
FIG. 9 is a photograph of a bonded structure employing a pre-applied underfill material according to an embodiment of the present disclosure.

Referring to FIG. 9, a bonded structure employing a pre-applied underfill material according to an embodiment of the present disclosure shows that a uniform fillet of the underfill material having substantially the same height and width throughout the periphery of a first semiconductor chip located above a packaging substrate. According to methods of the present disclosure, the fillet of the underfill material is cured slowly because the fillet of the underfill material is exposed to less radiation from peripheral portions of a bonder head than in prior art methods.

Figure 10:
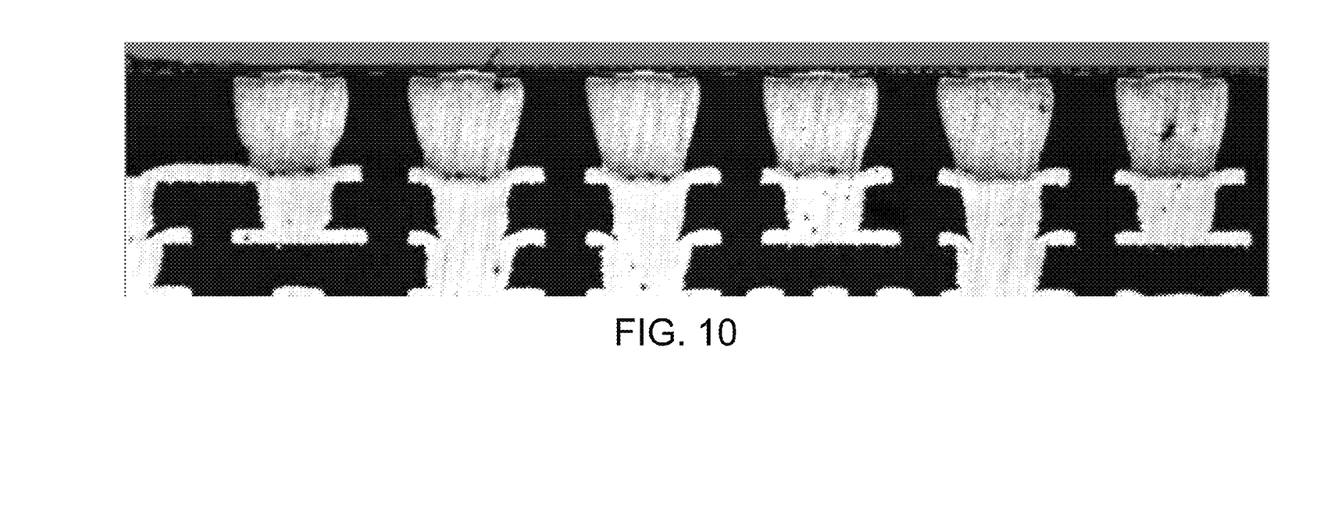
FIG. 10 is an optical micrograph of a cross-sectional area of a bonded structure formed by a method of the present disclosure.

The slow curing of the underfill material in the fillet increases the ability of the underfill material to deform at the periphery of the C4 array as well as forming a uniform shape for the fillet. Thus, bonding process of the present disclosure produces regular and uniform fillet shapes and sufficient flow of the underfill material in the outer chip area, and thereby making improved joints between two substrates. Referring to FIG. 10, the combination of the uniform shape of the fillet and the enhanced deformability of the underfill material especially at the periphery of the C4 array results in uniform and complete bonding of the C4 balls as illustrated by the absence of any boundary between C4 balls and underlying metallic materials. When the corner fillet is starved, a secondary fillet dispensing may require outside the chip area.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A bonding apparatus for C4 bonding comprising a bonder head, said bonder head including:
   a conductive plate comprising a high thermal conductivity material having a thermal conductivity greater than 10 W/(m·K);
   a heater assembly in direct contact with said conductive plate;
   a vacuum manifold extending through the heater assembly and the conductive plate, wherein the vacuum manifold provides a plurality of openings to at least one central portion of a bottom surface of the conductive plate;
   a low thermal conductivity material layer including at least one hole therein, wherein said low thermal conductivity material layer covers at least a peripheral portion of said bottom surface of said conductive plate and does not cover said at least one center portion of said bottom surface, and said low thermal conductivity material layer comprises a low thermal conductivity material having a thermal conductivity less than 10 W/(m·K); and
   a cavity having a sidewall defined by sidewalls of the low thermal conductivity material and an upper surface defined by an exposed portion of the bottom surface of the conductive plate between the sidewalls of the low thermal conductive material, wherein the cavity interconnects the plurality of openings extending from the vacuum manifold.

2. The bonding apparatus of claim 1, wherein said bottom surface of said conductive plate is planar, said at least one hole is a single hole, said at least one center portion is a single center portion.

3. The bonding apparatus of claim 2, wherein a cavity laterally surrounded by said low thermal conductivity material layer is present under said single center portion of a bottom surface of said conductive plate.

4. The bonding apparatus of claim 2, wherein said bonder head further comprises another conductive plate contacting said single center portion of said bottom surface and laterally surrounded by said low thermal conductivity material layer, wherein said other conductive plate comprises a material having a thermal conductivity greater than 10 W/(m·K).

5. The bonding apparatus of claim 1, wherein said bottom surface of said conductive plate is planar, said at least one hole is a plurality of holes, said at least one center portion is a plurality of center portions, and a cavity laterally surrounded by said low thermal conductivity material layer is present under each of said plurality of center portions of a bottom surface of said conductive plate.

6. The bonding apparatus of claim 1, wherein said low thermal conductivity material layer is a dielectric material layer.

7. The bonding apparatus of claim 6, wherein said low thermal conductivity material layer includes a polymer, a resin, or a combination thereof.

8. The bonding apparatus of claim 7, wherein said low thermal conductivity material layer is composed of polyimide.

9. The bonding apparatus of claim 1, wherein said vacuum manifold has at least one vacuum connection port configured to connect a vacuum pump.

10. The bonding apparatus of claim 1, wherein said bonder head is configured to hold a substrate upside down under said low thermal conductivity material layer.

11. The bonding apparatus of claim 10, wherein a bottom surface of said low thermal conductivity material layer is vertically offset from said bottom surface of said conductive plate.

12. The bonding apparatus of claim 10, further comprising a movement actuator configured to enable vertical movement of said bonder head relative to a fixture configured to hold another substrate underneath said substrate.

* * * * *